(12) United States Patent
Heinz et al.

(10) Patent No.: US 7,728,489 B2
(45) Date of Patent: Jun. 1, 2010

(54) PIEZOELECTRIC ACTUATOR WITH A SHEATH, FOR DISPOSITION IN A PIEZOELECTRIC INJECTOR

(75) Inventors: Rudolf Heinz, Renningen (DE); Dieter Kienzler, Leonberg (DE); Udo Schaich, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 50 days.

(21) Appl. No.: 11/846,736

(22) Filed: Aug. 29, 2007

(65) Prior Publication Data
US 2008/0265716 A1 Oct. 30, 2008

(30) Foreign Application Priority Data
Sep. 27, 2006 (DE) ................. 10 2006 045 663

(51) Int. Cl.
*H01L 41/08* (2006.01)
(52) U.S. Cl. .................. 310/325; 310/338; 310/340
(58) Field of Classification Search ................ 310/328, 310/325, 366, 340
See application file for complete search history.

(56) References Cited

U.S. PATENT DOCUMENTS

| 4,051,396 | A | * | 9/1977 | Berlincourt | ................. 310/339 |
| 4,553,059 | A |   | 11/1985 | Abe et al. | |
| 4,958,101 | A | * | 9/1990 | Takahashi et al. | ........... 310/328 |
| 5,239,223 | A | * | 8/1993 | Miyoshi | ..................... 310/328 |
| 5,455,477 | A | * | 10/1995 | Sano et al. | .................. 310/328 |
| 7,358,646 | B2 | * | 4/2008 | Asano et al. | ................ 310/328 |

FOREIGN PATENT DOCUMENTS

DE 10 2005 024 710 A1 12/2006

* cited by examiner

*Primary Examiner*—Mark Budd
(74) *Attorney, Agent, or Firm*—Ronald E. Greigg

(57) ABSTRACT

A piezoelectric actuator with piezoelectric elements, fastened between an actuator head and an actuator foot, and with a plastic sleeve surrounding at least the piezoelectric elements is proposed, which is set in a clamping ring on the actuator head and/or the actuator foot of the piezoelectric actuator. The respective clamping ring may be a metal part or a plastic part, which is equipped with clamping lugs suitable for setting the plastic sleeve and is thrust, pressed, or shrunk onto the respective actuator head and/or actuator foot of the steel piezoelectric actuator.

20 Claims, 3 Drawing Sheets

PIEZOELECTRIC ACTUATOR WITH A SHEATH, FOR DISPOSITION IN A PIEZOELECTRIC INJECTOR

REFERENCE TO FOREIGN PATENT APPLICATION

This application is based on German Patent Application No. 10 2006 045 663.7 filed 27 Sep. 2006, upon which priority is claimed.

BACKGROUND OF THE INVENTION

1. Field of the Invention

The invention relates to a piezoelectric actuator sheathed with a sleeve and bathed for instance by liquid media, which can be inserted into a piezoelectric injector for chronologically and quantitatively precise metering of fuel for an internal combustion engine. A piezoelectric injector of this kind substantially comprises a holder body and the piezoelectric actuator disposed in the holder body, the piezoelectric actuator having piezoelectric elements stacked one above the other and disposed in an actuator head and an actuator foot.

2. Description of the Prior Art

It is known per se that for constructing a piezoelectric actuator of the type described above, the piezoelectric elements can be inserted in such a way that by utilizing the so-called piezoelectric effect, a control of the needle stroke of a valve or the like can be accomplished. Piezoelectric layers of the piezoelectric elements are constructed from a material with a suitable crystalline structure, in such a way that when an external electrical voltage is applied, a mechanical reaction of the piezoelectric element ensues that, depending on the crystalline structure and the contact regions of the electrical voltage represents compression or tension in a predeterminable direction. Such piezoelectric actuators are suitable for instance for applications in which reciprocating motions take place under high actuation forces and at high cycle frequencies.

For example, one such piezoelectric actuator is known as a component of a piezoelectric injector in so-called common rail injection systems (CR injector), from German Patent Disclosure DE 100 26 005 A1. In this piezoelectric actuator, a stack of a plurality of electrically and mechanically coupled-together piezoelectric elements is present, and this stack is retained between two stops under initial tension via an actuator foot and an actuator head. Each piezoelectric layer is set between two inner electrodes, by way of which an electrical voltage can be applied from outside. Because of this electrical voltage, the piezoelectric elements then each execute short reciprocating motions in the direction of the potential drop, and these add up to make the total stroke of the piezoelectric actuator. This total stroke can be varied by way of the magnitude of the applied voltage and can be transmitted to a mechanical final control element.

In these known CR injectors, there is a nozzle needle controlled indirectly by the piezoelectric actuator; via a sleeve and diaphragm arrangement as a sheath, which compensates for stroke and temperature, the piezoelectric actuator is surrounded directly or indirectly by the pressure of the fuel, which in such low-pressure systems is approximately 60 bar.

In CR injectors with direct control of the nozzle needle, however, this known concept cannot readily be adopted, since in this case the piezoelectric actuator is operated in the high-pressure region of the fuel, and a rigid sleeve and diaphragm arrangement as a sheath would not withstand the high system pressures and the longer reciprocating motions of the piezoelectric actuator, under the space conditions available in the piezoelectric injector.

To achieve an electrical and mechanical insulation of the piezoelectric actuator, a flexible sheath of the piezoelectric actuator is often also proposed. From German Patent Disclosure DE 102 30 032 A1, to avoid the above-described disadvantages, an arrangement with a piezoelectric actuator in bathing media is known in which the piezoelectric elements are cast in an amorphous insulation compound, which in turn is placed in a housing jacket that is solidly closed off from the medium laterally and on the upper and lower ends.

OBJECT AND SUMMARY OF THE INVENTION

The invention is based on a piezoelectric actuator with piezoelectric elements, described at the outset, that is fastened between an actuator head and an actuator foot and in which a sleeve surrounding at least the piezoelectric elements is present as a component of the sheath. According to the invention, the sleeve is a plastic sleeve, which is set on the cylindrical actuator head and/or on the actuator foot with a cylindrical clamping ring. Advantageously, the respective clamping ring may be a metal part or a plastic part, which is equipped with clamping lugs that are suitable for setting the plastic sleeve and that in particular are also deformable, and is thrust, pressed, or shrunk onto the respective actuator head and/or actuator foot and thus firmly held.

The proposed CR injector may advantageously be constructed in such a way that a nozzle needle controlled directly by the piezoelectric actuator is present, and the control can be accomplished in one or two stages. Between the piezoelectric actuator and the nozzle needle, there is only a coupler with a hydraulic booster, so that the needle motion can be stepped up directly, and the coupler can follow the motion brought about by the piezoelectric actuator.

With the application of the plastic sleeve according to the invention, the piezoelectric actuator, which is located in the interior of the holder body, is protected in a simple way against harmful liquids, such as diesel fuel, water, and RME as conventional types of biodiesel fuel or other conductive substances, as well as particles, floating material, and the prevailing high pressures resulting from these substances and their pressure and temperature fluctuations.

In particular flexible plastic sleeves may be used here, which can be shrunk on or adapted in some other way to the component contour. The plastic sleeves intrinsically achieve the necessary sealing action from the piezoelectric actuators and assure an additional stroke and temperature compensation in the range required here, which is from −40 to +160° C. To attain secure sealing of the component combination, the plastic sleeve is sealed off or closed against an entry of media by the clamping rings of the invention on the open ends.

Advantageously, the respective clamping ring can be pre-centered or preoriented and additionally welded or glued to the actuator head and/or the actuator foot. Particularly when shrink-type hoses are used as the plastic sleeve, the contour of the actuator head and/or of the actuator foot can be tapered in the direction of the piezoelectric elements in such a way that the shrunk-on plastic sleeve easily conforms to them.

The actuator head and/or the actuator foot can also at least partially have a self-locking surface in the region or vicinity of the clamping with the clamping ring, and the self-locking surface can for instance comprise a fused glass inclusion or annular offsets or indentations. It is also possible for the respective clamping ring to have a soft coating, particularly of gold, on the side toward the actuator head and/or the actuator foot.

In a further embodiment of the invention, the respective clamping ring may rest on a conical actuator head and/or actuator foot that is chamfered on the side toward the piezoelectric elements. It is also especially advantageous if at least one clamping lug of the respective clamping ring has barbs or bite or sealing edges, which prevent the plastic sleeve from slipping out of the clamping ring.

Secure fastening of the plastic sleeve is also attainable by providing that the at least one outer clamping lug, before the introduction of the plastic sleeve, is bent outward and pressed, after the introduction of the plastic sleeve, against the plastic sleeve by calking. A type of fastening in which the plastic sleeve, in the region of the enclosure by means of the respective clamping ring, has a thickened portion that is prefabricated or made later and that comes to rest in a suitably shaped hollow chamber of the clamping ring, is also secure.

In summary, it can be stated that with the invention, an economical, simple, and durable sealing off of the ends of a plastic sleeve for preventing the entry of fuel or of actuator-damaging substances, in a piezoelectric actuator that operates in the high-pressure region of a liquid, is achieved over a long service life. By the shape or the resilient or other proposed properties of the clamping lugs of the respective clamping ring, or by the calking of the clamping ring lugs to the plastic sleeve, pressing of the plastic sleeve against the actuator head and/or the actuator foot of metal, and hence a good sealing action, are attained.

BRIEF DESCRIPTION OF THE DRAWINGS

The invention will be better understood and further objects and advantages thereof will become more apparent from the ensuing detailed description of preferred embodiments, taken in conjunction with the drawings, in which.

DESCRIPTION OF THE PREFERRED EMBODIMENTS

Figure 1:
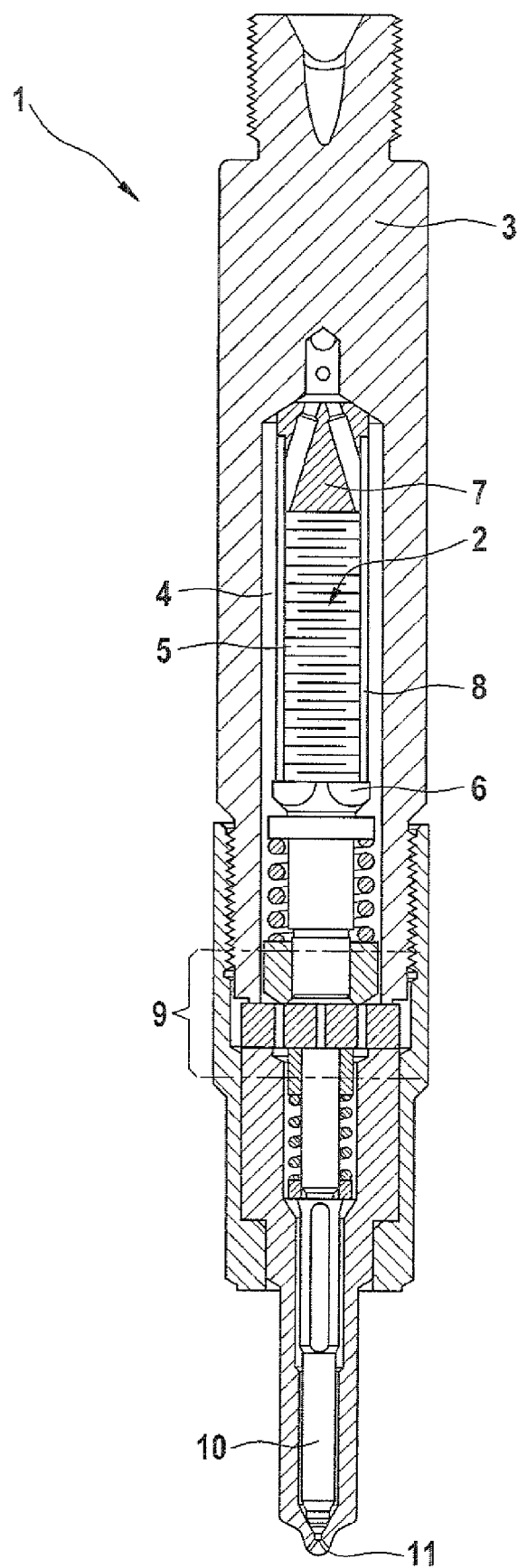
FIG. 1 is a section through a piezoelectric injector having a piezoelectric actuator in accordance with the prior art.

In FIG. 1, a basic construction of a piezoelectric injector 1 with a piezoelectric actuator 2 of the prior art is shown, which can be used for instance for needle stroke control in an injection system for fuel in an internal combustion engine. In the upper part, there is a holder body 3, which can be adapted in its geometric dimensions essentially to the particular intended application and the specific location where it will be used. By means of the holder body 3, with a specifically adapted plug embodiment, the electrical voltage is carried for triggering piezoelectric elements 5, which are stacked one above the other in an inner chamber 4 of the holder body 3 and which together with an actuator head 6 and an actuator foot 7 form the piezoelectric actuator 2. An insulating sleeve 8 shown here only schematically is placed as a sheath around the piezoelectric actuator 2.

Upon an actuation, as mentioned in the background section in terms of a piezoelectric injector, the piezoelectric elements 5 act on a nozzle needle 10, via a mechanical arrangement with a coupler 9 that in this case is located vertically below, in such a way that an opening of a nozzle opening 11 can be effected. Fuel carried in the interior of the piezoelectric injector 1 through the inner chamber 4 in the holder body 3 can thus be injected into the combustion chamber of an internal combustion engine, not shown here.

Below, exemplary embodiments of connections according to the invention of an insulating sleeve to suitably designed versions of a piezoelectric actuator will be explained.

Figure 2A:
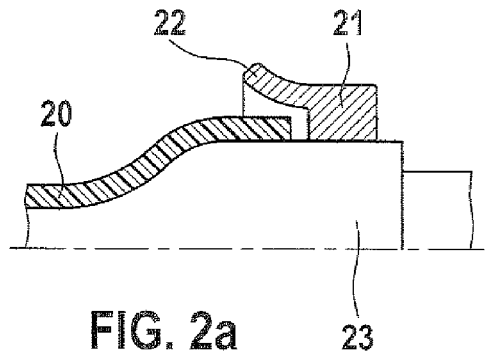
FIGS. 2a and 2b show a first version according to the invention of a clamping ring as a calking ring for securing a plastic sleeve to a piezoelectric actuator.

In FIG. 2a, a first exemplary embodiment can be seen, in which, as in the following exemplary embodiments, only the region where clamping rings are connected to a plastic sleeve, as an insulating sleeve, is shown. FIG. 2a shows a plastic sleeve 20 comprising a material capable of shrinkage under the influence of temperature, in the state in which it is shrunk onto the contour of the piezoelectric actuator, and also shows a clamping ring 21 which by means of a calkable clamping lug 22 receives the inserted plastic sleeve 20. The clamping ring 21 is thrust onto and fixed on a metal actuator foot 23 of the piezoelectric actuator (compare the actuator foot 7 of the piezoelectric actuator 2 in FIG. 1) by means of surface pairing, for instance via an O-ring, not shown here.

Figure 2B:
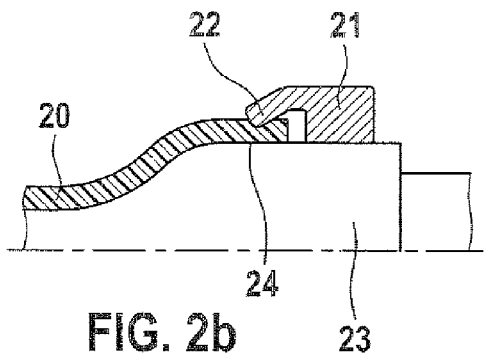

FIG. 2b shows the exemplary embodiment described above, with an already calked clamping lug 22, which penetrates the plastic sleeve 20 and thereby forms a sealed face 24.

Figure 3:
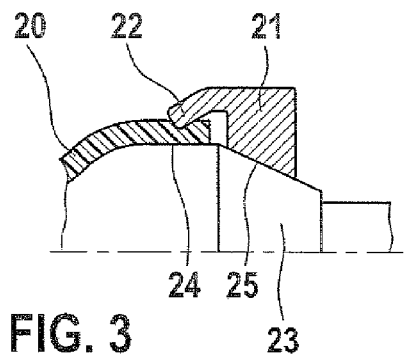
FIG. 3 shows a modification of the arrangement of the clamping ring of FIGS. 2a and 2b, with mounting of the clamping ring on a chamfer of an actuator foot.
Figure 4:
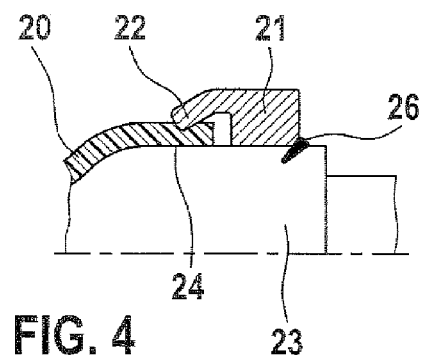
FIG. 4 shows a modification of the arrangement of the clamping ring of FIGS. 2a and 2b, with an additional weld seam of soldered seam.

In FIG. 3, a modification of the embodiment described above can be seen, in which the clamping ring 21 is seated in self-locking fashion on a chamfer 25, which is conical with a shallow angle, of the actuator foot 23, rather than on a cylindrical shape. However, still other geometric designs that have a self-locking effect are also conceivable. Because of this self-locking effect, any additional welded connection or other fastening provisions are superfluous, and a fused glass inclusion can additionally be attached here. FIG. 4 furthermore shows the additional placement, which may become necessary, of a welded or soldered seam 26 between the clamping ring 21 and the foot part 23.

Figure 5A:
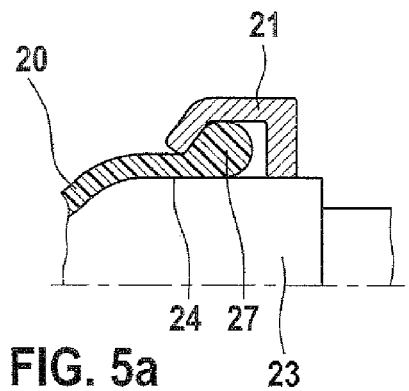
FIGS. 5a through 5c show exemplary embodiments with a clamping ring with a hollow chamber for receiving a thickened portion of the plastic sleeve.
Figure 5B:
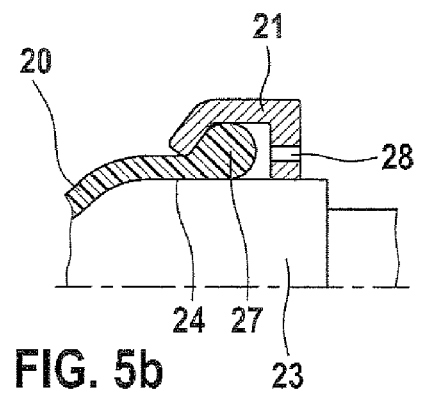

In FIG. 5a, an exemplary embodiment is shown in which the clamping ring 21 has a hollow chamber for receiving a thickened portion 27 of the plastic sleeve 20, as a result of which, in addition to the effect of the sealing face 24, an even more secure hold of the plastic sleeve 20 in the clamping lug 21 is attainable. FIG. 5b shows a modification with a pressure equalization bore 28 leading to the hollow chamber of the clamping ring 21, and FIG. 5c shows further possible designs of the thickened portion 27 as examples.

Figure 5C:
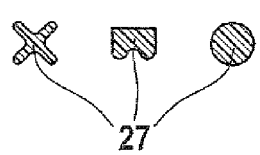

If the end of the plastic sleeve 20 is made thick in a shape similar to an O-ring, as described in conjunction with FIGS. 5a through 5c, then by means of the shape of the hollow chamber in the clamping ring 21, compartmentalization of the plastic sleeve 20 can be attained. If the plastic sleeve 20 is intended to have a swelling behavior, then as a result of the aforementioned compartmentalization, an additional positive sealing action is achieved. The swelling behavior and the resilience of bite edges of the clamping lugs 22 (see FIGS. 2a, 2b, 3, 4, 5a, and 5b) can compensate for possible fatigue phenomena, such as flowing, reduced elasticity, and so forth, of the material comprising the plastic sleeve 20. The thickening and prefabrication (see FIGS. 5a through 5c) can be attained in a simple and economical way in preceding work steps; in addition to the thickening, shaping elements for forming the thickened portions 27 can be vulcanized onto the plastic sleeve 20.

The remaining air volume between the end of the plastic sleeve 20 and the clamping ring 21 should be kept as small as possible, in order to minimize forcing out of the plastic sleeve 20 from the bite edge upon a pressure buildup in the volume. However, it must be expected that at no time can a higher pressure occur in the volume than in the surrounding system. If that should nevertheless be the case, then the volume can for instance be adapted to the ambient pressure and thus connected in a pressure-equalized way, for instance via the pressure equalization bore 28 described in conjunction with FIG. 5b.

Figure 6A:
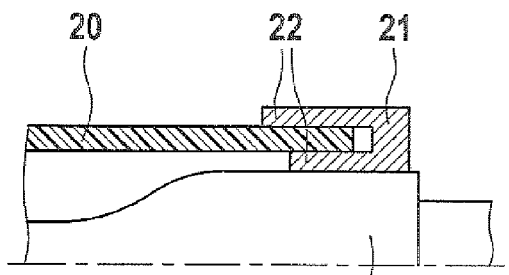
FIGS. 6a through 6c show further exemplary embodiments, with a clamping ring that has two clamping lugs, and also show a plastic sleeve, thrust into the resultant groove as a precentering means, in the unshrunk-on and in the shrunk-on state.
Figure 6B:
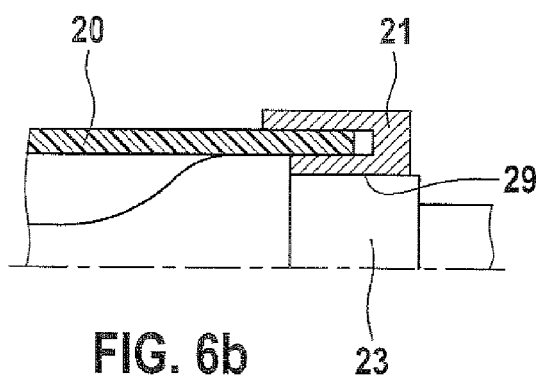
Figure 6C:
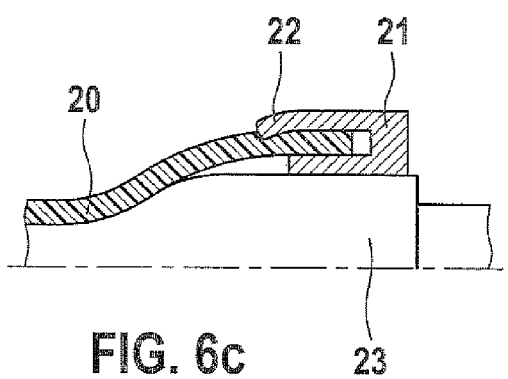

Further options in embodying the connection between the clamping ring 21 and the plastic sleeve 20 are shown in FIGS. 6a, 6b, and 6c. Here, the plastic sleeve 20 is shown first in the non-shrunk-on state in FIGS. 6a and 6b and is press-fitted between two clamping lugs 22 of the clamping ring 21. FIG. 6b shows one option for sinking the clamping ring 21 in a space-saving way in an offset 29 of the actuator foot 23, and FIG. 6c also shows the shrunk-on plastic sleeve 20 and the upper clamping lug 22 calked onto it.

Figure 7:
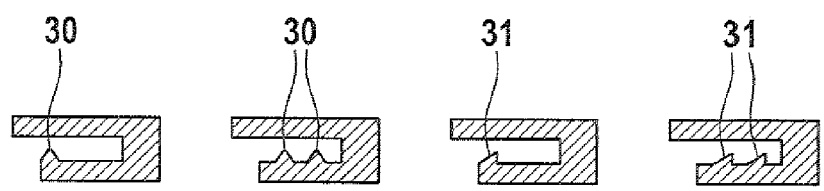
FIG. 7 shows exemplary embodiments of the clamping ring with barbs or beads.

FIG. 7 shows four exemplary embodiments of the clamping lugs 22 of the clamping ring 21 (compares FIGS. 6a through 6c) with beads 30 located on the inside, or with barbs 31, which are meant to prevent the plastic sleeve 20 from slipping out. The groove or space between the clamping lugs 22 in FIG. 7 acts as a guide and precentering means for the plastic sleeve 20 in the case of a single-step assembly concept of the plastic sleeve 20 in the clamping ring 21.

Figure 8:
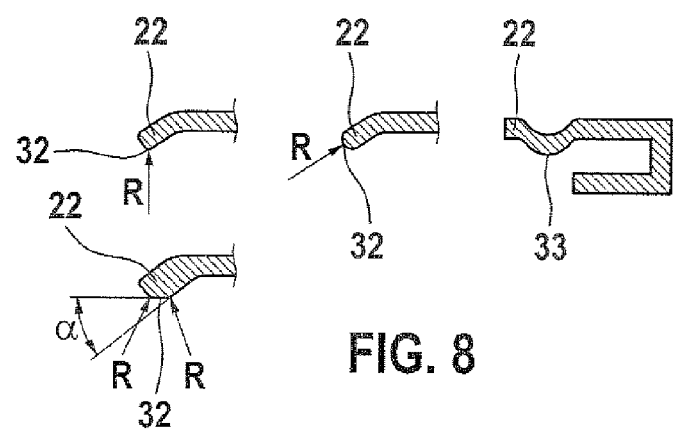
FIG. 8 shows exemplary embodiments of the clamping ring with various bite or sealing edges.

In FIG. 8, a further four modifications of the clamping lugs 22 can be seen, which are designed on the front end in such a way as to create in this case bite and sealing edges 32 or a spring element 33. The clamping lugs 22 with the bite and sealing edges 32 and spring 33 shown in FIG. 8 prevent the plastic sleeve 20 from being pulled out of the clamping ring 21 in the shrinkage operation. Depending on the design of the surface pairing between the clamping ring 21 and the metal on the actuator foot or the actuator head, in this case the actuator foot 23, the clamping ring is displaced longitudinally upon shrinkage, and pulling out of the plastic sleeve 20 from the clamping ring 21 is prevented.

The actual sealing action is generated, in the exemplary embodiments shown, at the sealing faces 24 (see FIG. 2b), pressed against by the respective bite and sealing edge (see 32 and 33 in FIG. 8), between the plastic sleeve 20 and the metal actuator head or the actuator foot 23. In addition, the bite and sealing edge 32 or spring 33, which after the clamping ring 21 has been pressed on are pressed into the material of the plastic sleeve 20 in a subsequent work step and create a high-pressure-proof positive engagement, assure further sealing locations, which contribute to increasing the security against the entry of media. At the same time, in this region the plastic sleeve 20 is held in its position by the bite and sealing edges 32, 33 and the clamping lugs 22.

The clamping rings 21 shown in the drawings along with their connection to the actuator foot 23 and the plastic sleeve 20 can also be provided with additional characteristics, not always explicitly shown here. It is advantageous here if a partner in the connection, preferably the clamping ring 21, is given a soft, easily deformable surface, for instance a gold-plated surface, on an elastic metal substrate. This soft surface provides for a strong sealing action because of the plastic positive engagement in the surface structures of the joined partners, that is, the actuator foot or actuator head and the clamping ring 21.

To save space, the metal actuator head or the actuator foot may be provided with offsets or indentations, to minimize the radial structure. This is helpful above all in the case of the preassembled, thrust-on variant of the clamping rings 21 in FIGS. 2a through 6c, since here the plastic sleeve 20 can be joined to the clamping ring 21 in a previous work step and positioned exactly above the indentation. Especially in large-scale mass production, this simplifies assembly considerably.

The foregoing relates to preferred exemplary embodiments of the invention, it being understood that other variants and embodiments thereof are possible within the spirit and scope of the invention, the latter being defined by the appended claims.

We claim:

1. A piezoelectric actuator, having piezoelectric elements fastened between a steel actuator head and a steel actuator foot, and having an insulating sleeve surrounding at least the piezoelectric elements, in which the insulating sleeve is a plastic sleeve set in a cylindrical clamping ring on the actuator head and/or on the actuator foot of the piezoelectric actuator, wherein the clamping ring is mounted directly on the actuator head and/or on the actuator foot such that a direct seal is provided between the clamping ring and the actuator head and/or actuator foot, and a seal is provided between the plastic sleeve and the actuator head and/or actuator foot via a clamping lug of the clamping ring.

2. The piezoelectric actuator as defined by claim 1, wherein the respective clamping ring is a metal part or a plastic part, which is equipped with at least one clamping lug suitable for enclosing and setting the end of the plastic sleeve which at least one clamping lug is thrust, pressed, or shrunken onto the actuator head and/or actuator foot, as applicable, of the steel piezoelectric actuator.

3. In a piezoelectric actuator, having piezoelectric elements fastened between a steel actuator head and a steel an actuator foot and having an insulating sleeve surrounding at least the piezoelectric elements, the improvement wherein the insulating sleeve is a plastic sleeve set in a cylindrical clamping ring at the cylindrical actuator head and/or at the actuator foot of the piezoelectric actuator, wherein the respective clamping ring is a metal part or a plastic part, which is equipped with at least one clamping lug suitable for enclosing and setting the end of the plastic sleeve which at least one clamping lug is thrust, pressed, or shrunken onto the actuator head and/or actuator foot, as applicable, of the steel piezoelectric actuator, and wherein the respective clamping ring is precentered or preoriented and is additionally welded, soldered, or glued to the actuator head and/or the actuator foot.

4. the piezoelectric actuator as defined by claim 1,wherein the plastic sleeve comprises a material that is capable of shrinkage under the influence of temperature.

5. the piezoelectric actuator as defined by claim 2,wherein the plastic sleeve comprises a material that is capable of shrinkage under the influence of temperature.

6. The piezoelectric actuator as defined by claim 3, wherein the plastic sleeve comprises a material that is capable of shrinkage under the influence of temperature.

7. The piezoelectric actuator as defined by claim 4, wherein the contour of the actuator head and/or the actuator foot of the piezoelectric actuator is tapered in the direction of the piezoelectric elements and the shrunk-on plastic sleeve conforms to it.

8. The piezoelectric actuator as defined by claim 1, wherein the plastic sleeve, in the vicinity of the clamping to the clamping ring, has at least in part a self-locking surface.

9. The piezoelectric actuator as defined by claim 2, wherein the plastic sleeve, in the vicinity of the clamping to the clamping ring, has at least in part a self-locking surface.

10. In a piezoelectric actuator, having piezoelectric elements fastened between a steel actuator head and a steel an actuator foot and having an insulating sleeve surrounding at least the piezoelectric elements, the improvement wherein the insulating sleeve is a plastic sleeve set in a cylindrical clamping ring at the cylindrical actuator head and/or at the actuator foot of the piezoelectric actuator, wherein the plastic sleeve, in the vicinity of the clamping to the clamping ring, has at least in part a self-locking surface, and wherein the self-locking surface comprises a fused glass inclusion or bonded glass.

11. The piezoelectric actuator as defined by claim 8, wherein the self-locking surface comprises annular offsets or indentations.

12. In a piezoelectric actuator, having piezoelectric elements fastened between a steel actuator head and a steel an actuator foot and having an insulating sleeve surrounding at least the piezoelectric elements the improvement wherein the insulating sleeve is a plastic sleeve set in a cylindrical clamping ring at the cylindrical actuator head and/or at the actuator foot of the piezoelectric actuator, wherein the plastic sleeve, in the vicinity of the clamping to the clamping ring, has at least in part a self-locking surface, and wherein the applicable clamping ring, on the side toward the actuator head and/or the actuator foot, has a soft coating.

13. The piezoelectric actuator as defined by claim 10, wherein the applicable clamping ring, on the side toward the actuator head and/or the actuator foot, has a soft coating.

14. In a piezoelectric actuator, having piezoelectric elements fastened between a steel actuator head and a steel an actuator foot and having an insulating sleeve surrounding at least the piezoelectric elements, the improvement wherein the insulating sleeve is a plastic sleeve set in a cylindrical clam in ring at the cylindrical actuator head and/or at the actuator foot of the piezoelectric actuator, wherein the plastic sleeve, in the vicinity of the clamping to the clamping ring, has at least in part a self-locking surface, wherein the self-locking surface comprises annular offsets or indentations, and wherein the applicable clamping ring, on the side toward the actuator head and/or the actuator foot, has a soft coating.

15. The piezoelectric actuator as defined by claim 1, wherein the actuator head and/or actuator foot of the piezoelectric actuator is chamfered conically on the side facing away from the piezoelectric elements, and wherein the clamping ring rests on the chamfered actuator head and/or actuator foot.

16. The piezoelectric actuator as defined by claim 2, wherein the actuator head and/or actuator foot of the piezoelectric actuator is chamfered conically on the side facing away from the piezoelectric elements, and wherein the clamping ring rests on the chamfered actuator head and/or actuator foot.

17. In a piezoelectric actuator, having piezoelectric elements fastened between a steel actuator head and a steel an actuator foot and having an insulating sleeve surrounding at least the piezoelectric elements, the improvement wherein the insulating sleeve is a plastic sleeve set in a cylindrical clamping ring at the cylindrical actuator head and/or at the actuator foot of the piezoelectric actuator, and wherein the clamping ring comprises at least one clamping lug comprises barbs or bite or sealing edges which prevent the plastic sleeve from slipping out of the clamping ring.

18. In a piezoelectric actuator, having piezoelectric elements fastened between a steel actuator head and a steel an actuator foot and having an insulating sleeve surrounding at least the piezoelectric elements, the improvement wherein the insulating sleeve is a plastic sleeve set in a cylindrical clamping ring at the cylindrical actuator head and/or at the actuator foot of the piezoelectric actuator, wherein the respective clamping ring is a metal part or a plastic part, which is equipped with at least one clamping lug suitable for enclosing and setting the end of the plastic sleeve which at least one clamping lug is thrust, pressed, or shrunken onto the actuator head and/or actuator foot, as applicable, of the steel piezoelectric actuator, and wherein the clamping ring comprises an outer clamping lug which bent outward before the introduction of the plastic sleeve and is pressed by calking against the plastic sleeve after the introduction of the plastic sleeve.

19. In a piezoelectric actuator, having piezoelectric elements fastened between a steel actuator head and a steel an actuator foot and having an insulating sleeve surrounding at least the piezoelectric elements, the improvement wherein the insulating sleeve is a plastic sleeve set in a cylindrical clamping ring at the cylindrical actuator head and/or at the actuator foot of the piezoelectric actuator, wherein the respective clamping ring is a metal part or a plastic part, which is equipped with at least one clamping lug suitable for enclosing and setting the end of the plastic sleeve which at least one clamping lug is thrust, pressed, or shrunken onto the actuator head and/or actuator foot, as applicable, of the steel piezoelectric actuator, and wherein the plastic sleeve, in the region of the enclosure by the respective clamping lug comprises a thickened portion which is prefabricated or made later and which comes to rest in a suitably shaped hollow chamber, optionally provided with a pressure equalization bore, of the clamping ring.

20. The piezoelectric actuator as defined by claim 1, wherein the piezoelectric actuator is a component of a piezoelectric injector with direct needle triggered for an injection system for fuel in an internal combustion engine, and the fuel bathes the plastic sleeve at high pressure.

* * * * *